US011810889B2

(12) United States Patent
Uhlemann et al.

(10) Patent No.: US 11,810,889 B2
(45) Date of Patent: Nov. 7, 2023

(54) EXTERNAL CONTACT ELEMENT FOR A POWER SEMICONDUCTOR MODULE AND POWER SEMICONDUCTOR MODULE

(71) Applicant: Infineon Technologies AG, Neubiberg (DE)

(72) Inventors: Andre Uhlemann, Wickede (DE); Christoph Koch, Salzkotten (DE)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 17/676,350

(22) Filed: Feb. 21, 2022

(65) Prior Publication Data

US 2022/0278070 A1  Sep. 1, 2022

(30) Foreign Application Priority Data

Mar. 1, 2021  (DE) .......................... 102021104793.5

(51) Int. Cl.
*H01L 23/00*  (2006.01)

(52) U.S. Cl.
CPC .................................. *H01L 24/72* (2013.01)

(58) Field of Classification Search
CPC ....................................................... H01L 24/72
USPC ....................................................... 257/688
See application file for complete search history.

(56) References Cited

U.S. PATENT DOCUMENTS

| 6,246,587 | B1 | 6/2001 | Chen | |
| 6,727,579 | B1* | 4/2004 | Eldridge | ................ H01L 24/72 |
| | | | | 257/E23.024 |
| 8,485,418 | B2* | 7/2013 | Eldridge | .............. B23K 20/004 |
| | | | | 228/180.5 |
| 2021/0028125 | A1* | 1/2021 | Dangelmaier | ........ H01L 21/565 |

FOREIGN PATENT DOCUMENTS

| DE | 102005016650 A1 | 11/2006 |
| DE | 102006014582 A1 | 10/2007 |
| DE | 19758864 B4 | 3/2013 |
| DE | 112015000513 T5 | 11/2016 |
| DE | 102017200256 A1 | 8/2017 |
| DE | 102017211336 A1 | 1/2019 |
| EP | 2498290 A1 | 9/2012 |
| JP | H0547989 A | 2/1993 |

* cited by examiner

*Primary Examiner* — Ajay Arora
(74) *Attorney, Agent, or Firm* — Murphy, Bilak & Homiller, PLLC

(57) ABSTRACT

An external contact element for a power semiconductor module includes a bonded blank strip, the bonded blank strip being formed such that the external contact element includes: a first contact portion configured to be coupled to the power semiconductor module by a first solder joint, a second contact portion spaced from the first contact portion in a thickness direction out of the plane of the first contact portion, the second contact portion being configured to be coupled to an external appliance, and a spring portion connecting the first and second contact portions to each other and configured to compensate a movement along the thickness direction. The bonded blank strip includes a first (Continued)

sheet of a first metal or first metal alloy and a second sheet of a different second metal or second metal alloy. The second sheet is omitted from at least a substantial part of the first contact portion.

20 Claims, 6 Drawing Sheets

EXTERNAL CONTACT ELEMENT FOR A POWER SEMICONDUCTOR MODULE AND POWER SEMICONDUCTOR MODULE

TECHNICAL FIELD

This disclosure relates in general to an external contact element for a power semiconductor module as well as to a power semiconductor module comprising an external contact element.

BACKGROUND

It may be necessary to provide reliable electrical connections between semiconductor modules, in particular power semiconductor modules, and external appliances. These electrical connections may e.g. be provided by external contact elements which may e.g. comprise a metal strip or a sheet metal strip and which may be configured to carry a strong electrical current and/or a high voltage. These electrical connections may furthermore comprise a solder joint or a welded joint or a sintered joint which couples the external contact element to a carrier of the semiconductor module. Mechanical stress, e.g. induced by thermal expansion or thermal shrinkage of metal, may damage the joint and may cause an electrical failure of the electrical connection. It may therefore be beneficial to prevent or at least reduce mechanical stress from occurring in these electrical connections. Improved external contact elements as well as improved semiconductor modules comprising external contact elements may help with solving these and other problems.

The problem on which the invention is based is solved by the features of the independent claims. Further advantageous examples are described in the dependent claims.

SUMMARY

Various aspects pertain to an external contact element for a power semiconductor module, wherein the external contact element comprises a bonded blank strip, the bonded blank strip being formed such that the external contact element comprises: a first contact portion configured to be coupled to the power semiconductor module by a first solder joint, a second contact portion spaced from the first contact portion in a thickness direction out of the plane of the first contact portion, the second contact portion being configured to be coupled to an external appliance, and a spring portion connecting the first and second contact portions to each other and configured to compensate a movement along the thickness direction, wherein the bonded blank strip comprises a first sheet comprising a first metal or first metal alloy and a second sheet comprising a different second metal or second metal alloy, and wherein the second sheet is omitted from at least a substantial part of the first contact portion.

Various aspects pertain to an external contact element for a power semiconductor module, wherein the external contact element comprises a sheet metal, the sheet metal being formed such that the external contact element comprises: a first contact portion configured to be coupled to the power semiconductor module by a first solder joint, a second contact portion spaced from the first contact portion in a thickness direction out of the plane of the first contact portion, the second contact portion being configured to be coupled to an external appliance, and a spring portion connecting the first and second contact portions to each other and configured to compensate a movement along the thickness direction, wherein the sheet metal comprises a first metal or first metal alloy, and wherein the first contact portion comprises at least two spacers separated by a groove such that a thickness of the first solder joint in the groove is defined by the height of the spacers.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, a particular feature or aspect of an example may be disclosed with respect to only one of several implementations. Such a feature or aspect however may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

An efficient external contact element as well as an efficient semiconductor module may for example reduce material consumption, ohmic losses and chemical waste and may thus enable energy and/or resource savings. Improved external contact elements as well as improved semiconductor modules, as specified in this description, may thus at least indirectly contribute to green technology solutions, i.e. climate-friendly solutions providing a mitigation of energy and/or resource use.

Further, an "alloy of X" (including further components Y, Z, . . . ) means that X is the majority component of the alloy, i.e. the contribution of X in % wt (percentage in weight) is greater than the contribution of Y in % wt and the contribution of Z in % wt, respectively. In particular, it may mean that the contribution of X is at least 50% wt. The notation XY refers to an alloy of X including at least Y as a further component. In particular, it may refer to an alloy of X including Y as a sole residual component (i.e. a closed composition). That is, in the second case, the notation XY means that the alloy XY has a composition comprising of X (of the percentage in weight of X) and Y (of the percentage in weight of Y), the balance being only inevitable elements. The same applies to solder compositions.

Figure 1:
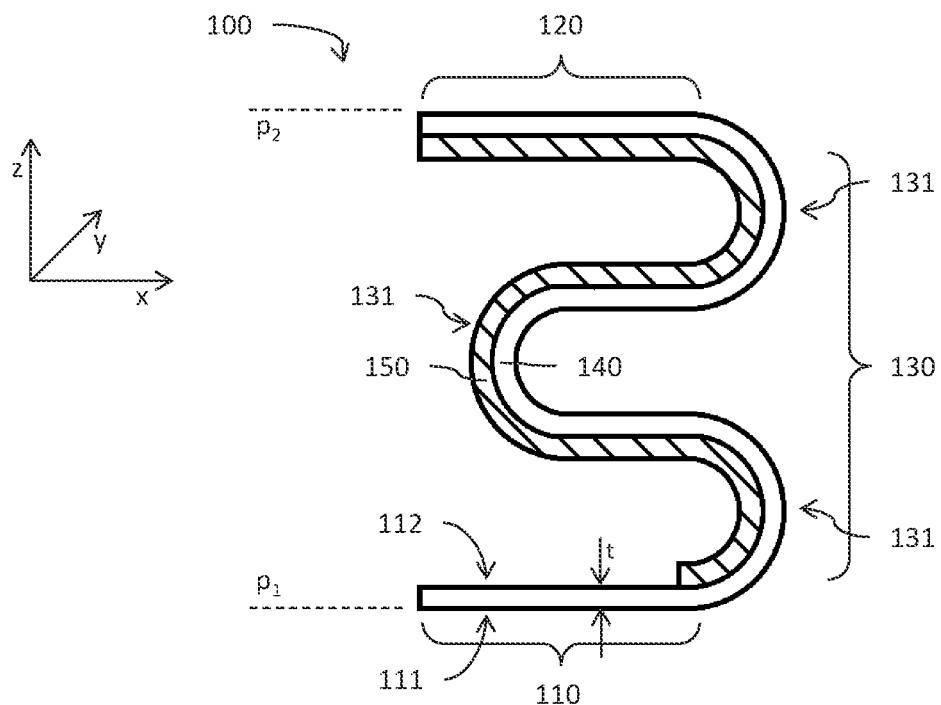
FIG. 1 shows a sectional view of an external contact element comprising first and second metal sheets, wherein the second metal sheet is omitted from a first contact portion of the external contact element.

FIG. 1 shows an external contact element 100 configured for use in a power semiconductor module. The external contact element 100 comprises of a bonded blank strip which is formed such that the external contact element 100 comprises a first contact portion 110, a second contact portion 120 and a spring portion 130.

The first contact portion 110 is configured to be coupled to the power semiconductor module by a first solder joint. The second contact portion 120 is spaced apart from the first contact portion 110 in a thickness direction z out of the plane $p_1$ (termed "first plane" in the following) of the first contact portion 110. The second contact portion 120 is configured to be coupled to an external appliance.

The spring portion 130 connects the first and second contact portions 110, 120 to each other and is further configured to compensate a movement along the thickness direction z (i.e. a movement of the semiconductor module and the external appliance relative to each other).

The bonded blank strip comprises a first sheet 140 comprising a first metal or first metal alloy and a second sheet 150 comprising a different second metal or second metal alloy. Furthermore, the second sheet 150 is omitted from at least a substantial part of the first contact portion 110. The second sheet 150 may in particular be omitted from the entirety of the first contact portion 110.

As shown in FIG. 1, the first contact portion 110 may comprise a first side 111 configured to face the semiconductor module and an opposing second side 112 configured to face away from the semiconductor module. The second sheet 150 may be omitted from at least a substantial part or even from the entirety of the second side 112.

The presence of the second sheet 150 in the first contact portion 110 could negatively affect the formation of the first solder joint. For example, the first solder joint may exhibit a reduced mechanical bond strength compared to the case that the second sheet 150 is omitted from the first contact portion 110. This may in particular be the case for an external contact element 100, wherein the first sheet 140 comprises or consists of Cu or a Cu alloy and the second sheet 150 comprises or consists of Al or an Al alloy. Omitting the second sheet 150 from the first contact portion 110 may increase the lifetime of the first solder joint by about a factor of two. The same effect may of course also be observed at the second contact portion 120. Therefore, in the case that the second contact portion 120 is configured to be coupled to the external appliance by a second solder joint, it may be desirable to omit the second sheet 150 from the second contact portion 120 as well.

According to an example, the second sheet 150 is also omitted from at least a substantial part of the second contact portion 120 or even from the entirety of the second contact portion 120. This may in particular be the case if the second contact portion 120 is configured to be coupled to the external appliance by a second solder joint. If however the second contact portion 120 is configured to be coupled to the external appliance by e.g. a rivet or a screw, it may not necessarily be desirable to omit the second sheet 150 from the second contact portion 120.

The second contact portion 120 may be arranged in a second plane $p_2$ which may be arranged above the first plane $p_1$. According to an example, the first plane $p_1$ and the second plane $p_2$ are parallel to each other. According to another example, the second plane $p_2$ is inclined with respect to the first plane $p_1$ (this may for example be the case for an external appliance with an inclined contact area). The first plane $p_1$ and/or the second plane $p_2$ may be arranged perpendicular to the thickness direction z of the external contact element 100.

The bonded blank strip may e.g. have an essentially rectangular cross section (as viewed in the yz-plane of FIG. 1). The first and second contact portions 110, 120 may have an essentially rectangular or quadratic shape (as viewed in the xy-plane of FIG. 1). The first and second contact portions 110, 120 may have similar shapes and similar surface areas or they may have different shapes and/or different surface areas.

The first contact portion 110 and/or the second contact portion 120 may e.g. have a length along the x-axis of FIG. 1 in the range of 2 mm to 15 mm, or 3 mm to 10 mm, or 4 mm to 8 mm, or about 7 mm. The spring portion 120 may e.g. have a length along the z-axis of FIG. 1 in the range of 3 mm to 20 mm, or 4 mm to 15 mm, or 5 mm to 10 mm, or about 9 mm. The entire extension of the external contact element 100 along the z-axis may essentially be made up by the length of the spring portion 130. The bonded blank strip may e.g. have a width along the y-axis of FIG. 1 in the range of 2 mm to 15 mm, or 4 mm to 10 mm. The first sheet 140 may e.g. have a thickness t in the range of 0.1 mm to 0.5 mm, or 0.2 mm to 0.4 mm, or about 0.3 mm. A thickness of the second sheet 150 may also lie in this range. However, the first and second sheets 140, 150 do not necessarily have to have an identical thickness.

The spring portion 130 may comprise one or more arcs 131, for example three arcs 131, as shown in FIG. 1. The number, the size and the exact form of the arcs 131 may depend on the desired spring rate of the spring portion 130. The arcs 131 may have an extension along the x-axis that is similar to the extension along the x-axis of the contact portions 110, 120. The first sheet 140 and also the second sheet 150 may extend along the entire spring portion 130.

The spring portion 130 may essentially form a compression spring or an extension spring, depending on the movement of the semiconductor module and the external appliance relative to each other.

The external contact element 100 may be shaped such that if viewed from the right in FIG. 1, only the first sheet 140 is visible and if viewed from the left in FIG. 1, only the second sheet 150 is visible (except for the part of the first sheet 140 exposed in the first contact portion 110). According to this example, the external contact element 100 may have the shape of a flat spring but not the shape of a coil spring or helical spring.

The first sheet 140 may e.g. comprise or consist of Cu or a Cu alloy. The second sheet 150 may e.g. comprise or consist of Al or an Al alloy. According to another example, the first and/or the second sheet 140, 150 may comprise other suitable metals, e.g. selected from the group comprising Au, Ag, Fe and Ti. The first sheet 140 may comprise or consist of a solderable metal or a solderable metal alloy.

Figure 2:
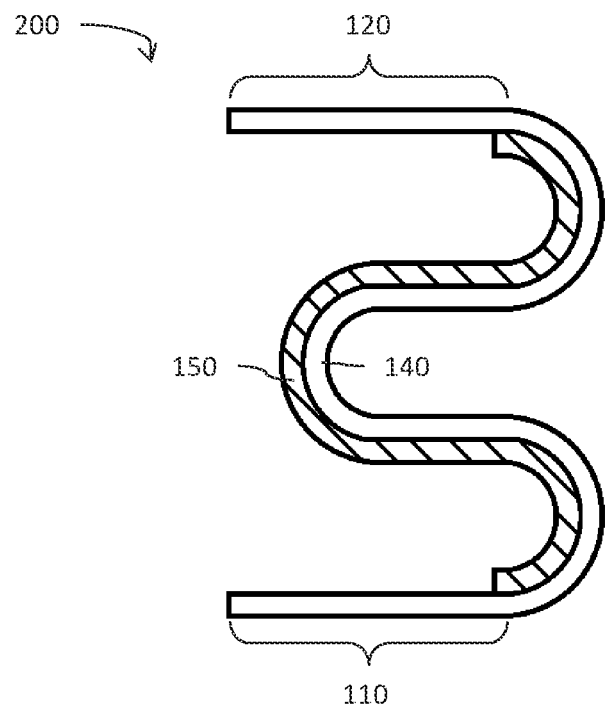
FIG. 2 shows a sectional view of a further external contact element, wherein the second sheet is also omitted from a second contact portion of the external contact element.

FIG. 2 shows a further external contact element 200 which may be similar to or identical with the external contact element 100 shown in FIG. 1, except that the second sheet 150 is omitted from both contact portions 110, 120. The second contact portion 120 of external contact element 200 may be configured to be coupled to an external appliance by a second solder joint.

Figure 3A:
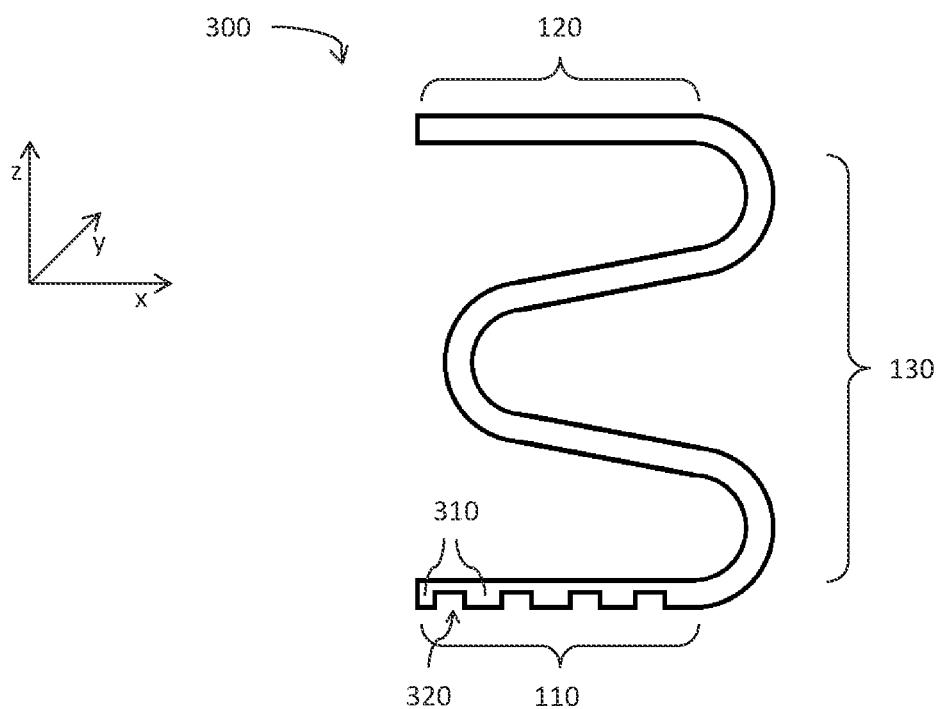
FIGS. 3A to 3C show sectional views of further external contact elements, wherein the first contact portion comprises spacers.
Figure 3B:
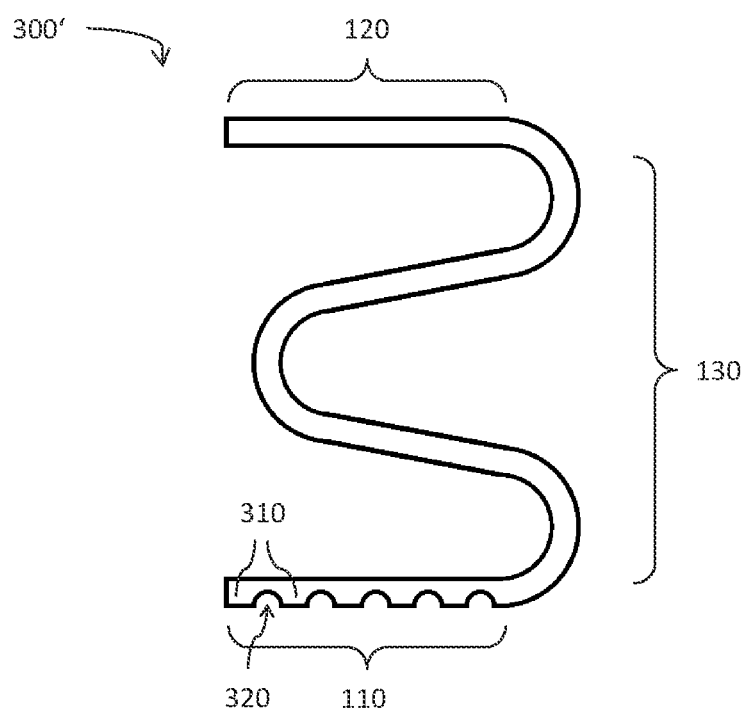
Figure 3C:
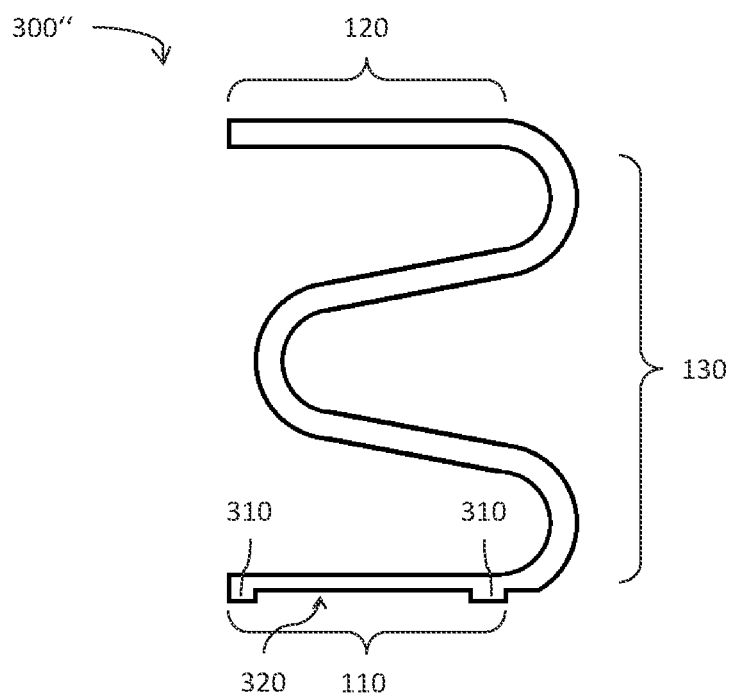

FIGS. 3A to 3C show further external contact elements 300, 300' and 300" which may be similar to or identical with the external contact elements 100 and 200, except for the differences described in the following.

In particular, the external contact elements 300, 300' and 300" do not comprise two sheets 140, 150 but instead comprises a single sheet metal strip bent into shape to comprise the contact portions 110, 120 and the spring portion 130. The external contact elements 300, 300' and 300" may e.g. comprise or consist of one or more of the metals or metal alloys disclosed with respect to the first sheet 140. The external contact elements 300, 300' and 300" may have identical dimensions and shapes as disclosed for the external contact element 100. The sheet metal strip of the external contact elements 300, 300' and 300" may have the same thickness as disclosed for the first sheet 140.

Since the spring portion 130 of the external contact elements 300, 300' and 300" does not comprise the second sheet 150 its spring rate may be lower than the spring rate of the external contact elements 100 and 200. However, a thicker sheet metal strip or a wider sheet metal strip (extension in the y-axis) may be used to increase the spring rate.

The first contact portion 110 of the external contact elements 300, 300' and 300" comprises at least two spacers 310 which are separated by a groove 320. The spacers 310 and the groove 320 are configured such that a thickness of the first solder joint (coupling the external contact element to a semiconductor module) in the groove 320 is defined by the height of the spacers 310 (the height of the spacers 310 is measured along the z-axis).

For example, the spacers 310 may be configured such that a thickness of the first solder joint directly below each spacer 310 is zero or at least close to zero (e.g. less than 20% or even less than 10% of the thickness of the first solder joint in the grooves 320). A footprint of the spacers 310 may for example be small enough that liquid solder material is readily pressed out from under the spacers 310 and fills the grooves 320.

The height of the spacers 310 may for example be in the range of 20% to 80% of the thickness of the sheet metal strip (i.e. the thickness of the external contact elements 300, 300', 300"), in particular in the range of 30% to 60%, or about 40% of the thickness of the sheet metal strip.

The spacers 310 may be part of the sheet metal strip of the external contact elements 300, 300', 300". The spacers 310, respectively the grooves 320 may for example be fabricated by punching, bending, etching or cutting the sheet metal strip. The thickness of the sheet metal strip at a spot comprising a spacer 310 may equal the thickness of the sheet metal strip in the spring portion 130. The thickness of the sheet metal strip may be reduced in a spot comprising a groove 320.

According to an example, the spacers 310 and grooves 320 are fabricated in the same fabrication step in which the external contact elements 300, 300' and 300" are bent into shape. According to another example, the spacers 310 and grooves 320 are fabricated before or after the shapes of the contact portions 110, 120 and the spring portion 130 are formed.

Although the thickness of the external contact elements 300, 300' and 300" is reduced in the grooves 320, their mechanical stability does not have to be negatively affected by this reduced thickness because the first solder joint may mechanically reinforce the external contact elements in the first contact portion 110.

The groove 320 may have any suitable form, e.g. an essentially rectangular shape as viewed in the xz-plane and shown in FIGS. 3A and 3C or a rounded shape as shown in FIG. 3B. According to an example, the spacers 310 and/or the grooves 320 extend along the entire width (along the y-axis) of the contact portion 110. According to another example, the spacers 310 and/or the grooves 320 extend only partially along the width. In this case, the spacers 310 and grooves 320 may for example be arranged in the first contact portion 110 in a kind of checkerboard pattern.

The grooves 320 may make up any suitable fraction of the surface area of the first contact portion 110, for example about 20% or more, or 40% or more, or 60% or more, or even 80% or more. The remainder of the surface area may be made up by the spacers 310.

According to an example, the second contact portion 120 as well comprises the spacers 310 and grooves 320. According to an example, the external contact elements 100 and 200 as well may comprise the spacers 310 and grooves 320 as described with respect to the external contact elements 300, 300' and 300". In this case the spacers 310 and grooves 320 may in particular be part of the first sheet 140.

Figure 4:
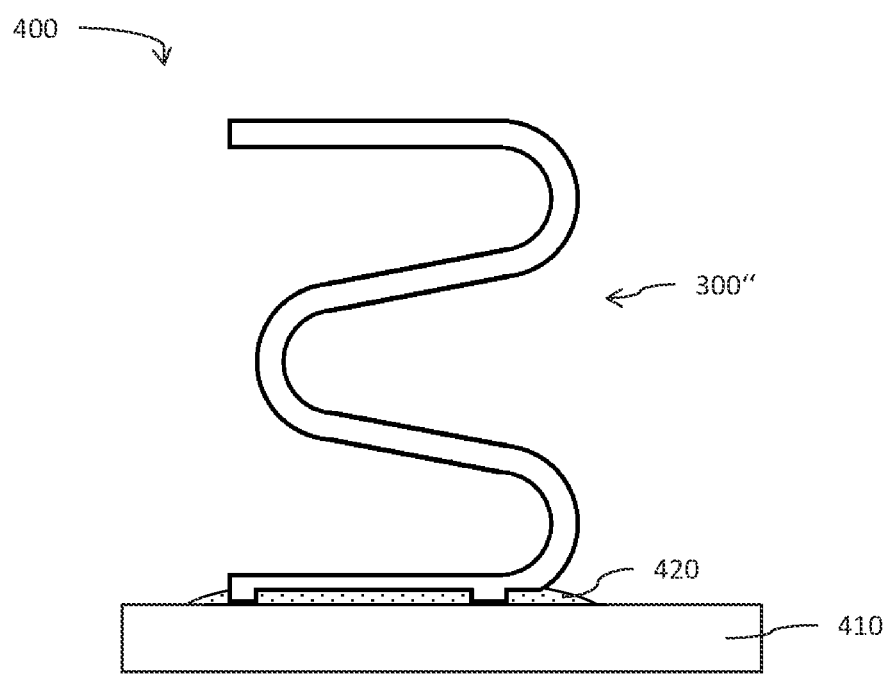
FIG. 4 shows a sectional view of a semiconductor module comprising an external contact element soldered to a carrier.

FIG. 4 shows a detail view of a part of a semiconductor module 400 comprising the external contact element 300" and a carrier 410. According to an example, the semiconductor module 400 may instead or in addition to the external contact element 300" comprise one or more of the external contact elements 100, 200, 300 and 300'.

The external contact element 300" is arranged on the carrier 410 such that the spacers 310 and groove 320 face the carrier 410. The first solder joint 420 is arranged on the first contact portion 110 and electrically and mechanically couples the external contact element 300" to the carrier 410.

The carrier 410 may be any suitable type of carrier, e.g. a carrier of the type direct copper bond (DCB), direct aluminum bond (DAB), active metal brazing (AMB), printed circuit board (PCB), etc. The semiconductor module 400 comprises one or more semiconductor chips arranged on and electrically coupled to the carrier 410. The semiconductor chips may be arranged on the same side of the carrier 410 as the external contact element 300" and/or on the opposite side.

The semiconductor module 400 may be a power semiconductor module configured to operate with a high voltage and/or a high current. In this case, the external contact element 300" may be configured as an external power contact of the semiconductor module 400. The semiconductor module 400 may comprise any suitable type of circuitry and may for example comprise a converter, an inverter, a half-bridge circuit, etc.

Figure 5A:
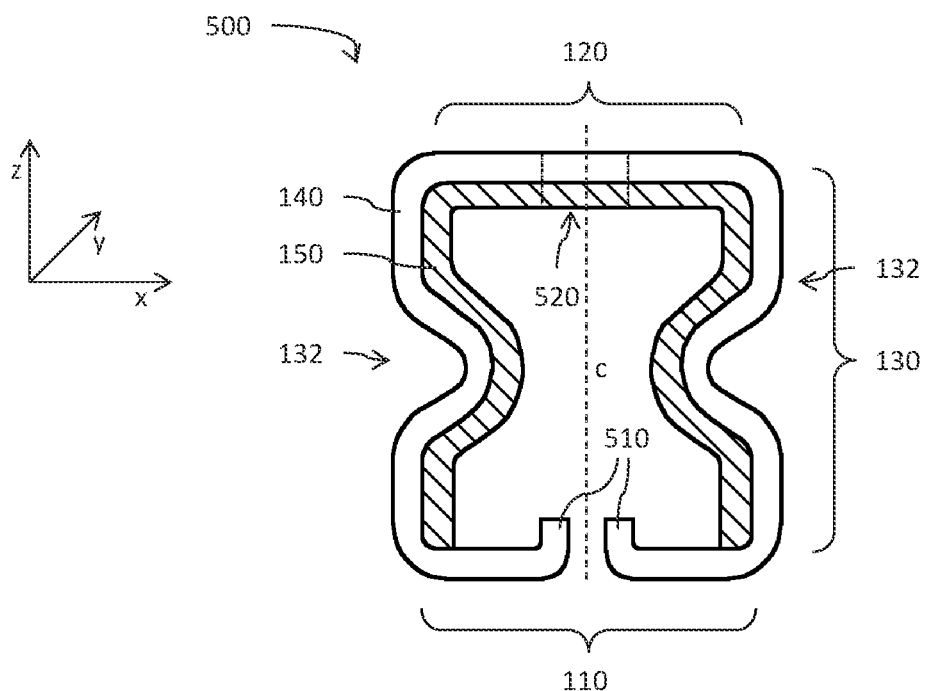
FIGS. 5A to 5C show a sectional view of further external contact elements comprising two compression or extension springs arranged laterally next to each other.
Figure 5B:
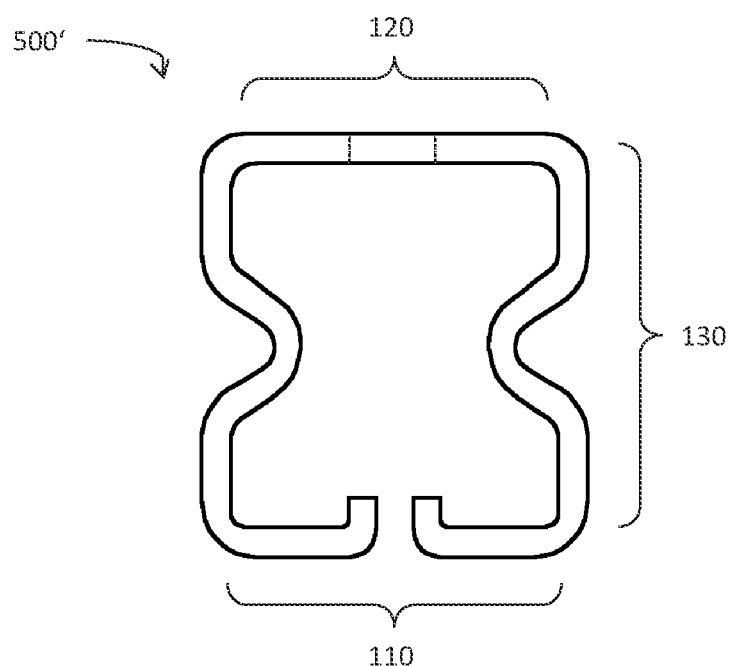
Figure 5C:
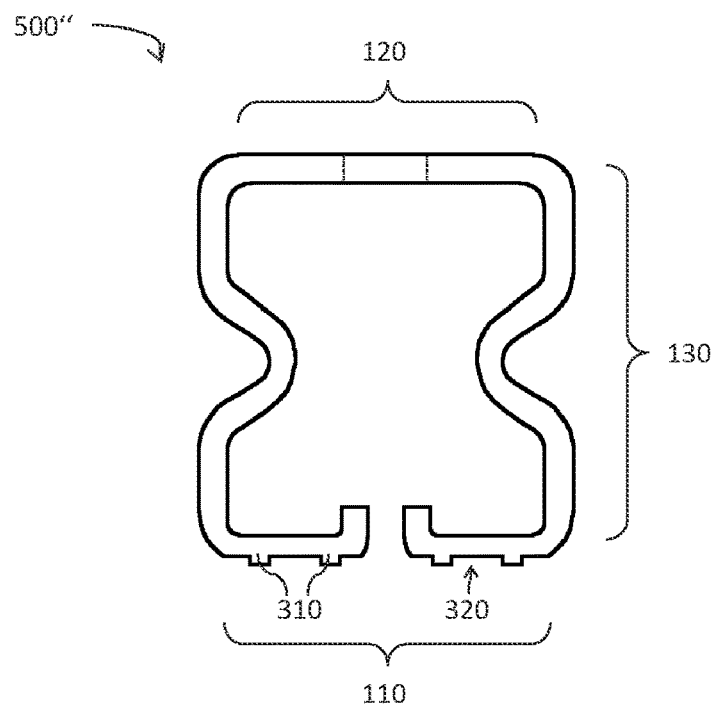

FIGS. 5A to 5C show further external contact elements 500, 500' and 500" which may be similar to or identical with the external contact elements 100 to 300", except for the differences described in the following.

In particular, the spring portion 130 of the external contact elements 500, 500' and 500" comprises two compression or extension springs 132 arranged laterally next to each other. The two compression or extension springs 132 may for example be arranged on both sides of a central axis c of the external contact elements 500, 500' and 500".

The external contact elements 500, 500' and 500" may have a greater spring rate than the external contact elements 100 to 300", for example about twice the spring rate. The external contact element 500 shown in FIG. 5A may comprise the first and second sheets 140, 150. The external contact elements 500' and 500" shown in FIGS. 5B and 5C, respectively, may comprise only a single sheet metal strip, similar to the external contact elements 300 to 300". Furthermore, the external contact element 500" also comprises the spacers 310 and groove 320 described with respect to FIGS. 3A to 3C.

As shown in FIG. 5A, the second sheet 150 is omitted from the first contact portion 110 of the external contact element 500. The second sheet 150 may or may not be omitted from the second contact portion 120. The first contact portion 110 may comprise both ends 510 of the bonded blank strip constituting the external contact element 500. The ends 510 may be bent upwards (away from the first contact portion 110), e.g. in order to provide a smooth surface in the first contact portion 110.

According to an example, the second contact portion 120 of the external contact elements 500, 500' and 500" comprises a through hole 520 configured to accept a rivet or a screw. The central axis c may run through the through hole 520. The two compression or extension springs 132 may be spaced apart from each other such that a riveting equipment or a screwing equipment can readily place the rivet, respectively the screw into the through hole 520 and couple the second contact portion 120 to an external appliance.

Figure 6:
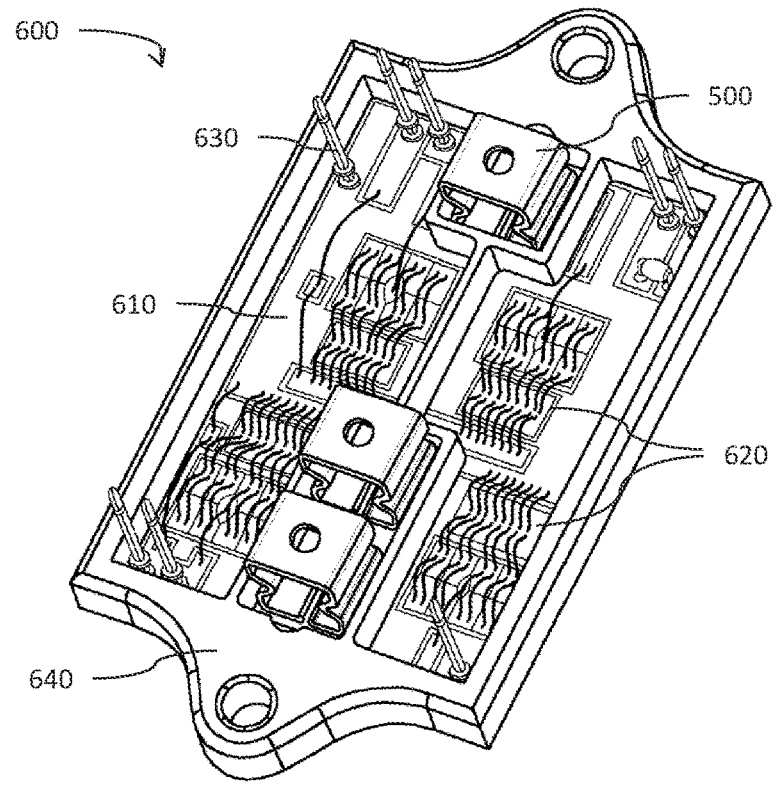
FIG. 6 shows a perspective view of a semiconductor module comprising a plurality of external contact elements.

FIG. 6 shows a perspective view of a semiconductor module 600 comprising a plurality of external contact elements 500, a carrier 610, a plurality of semiconductor chips 620 and a plurality of control contact elements 630. The semiconductor module 600 may be a power semiconductor module and the semiconductor chips 620 may be power semiconductor chips. Instead or in addition to the external contact elements 500, the semiconductor module 600 may also comprise anyone of the external contact elements 100 to 300", 500' and 500".

According to an example, the external contact elements 500, the semiconductor chips 620 and the control contact elements 630 are all arranged on the same side of the carrier 610 and are electrically coupled to it.

The external contact elements 500 may be external power contacts of the semiconductor module 600, e.g. one contact for a positive voltage, one contact for a negative voltage and one phase contact. The control contact elements 630 may be configured to transmit an external control signal to the power semiconductor module 600 or to transmit a control signal or a sensing signal from the semiconductor module 600 to the outside. According to an example, the control contact elements 630 are pins, in particular pressfit pins or soldering pins.

According to an example, the semiconductor module 600 further comprises an encapsulation 640 encapsulating the carrier 610 and the semiconductor chips 620. The external contact elements 500 and the control contact elements 630 may stick out of the encapsulation 640. The encapsulation 640 may for example comprise a plastic frame and/or a molded body.

According to an example, the external contact elements 500 and control contact elements 630 are arranged on a first side of the semiconductor module 600 and an opposing second side is configured to be coupled to a heatsink.

Figure 7A:
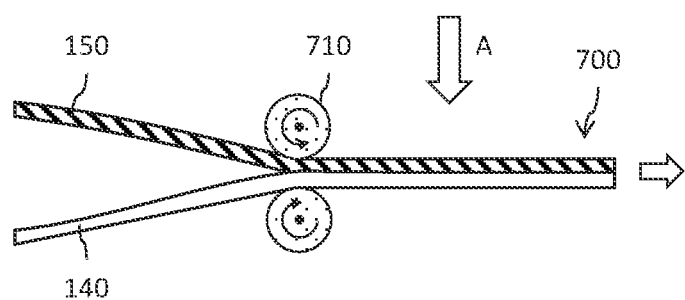
FIGS. 7A and 7B show a fabrication process of a bonded blank, wherein the bonded blank may be used to fabricate external contact elements.
Figure 7B:
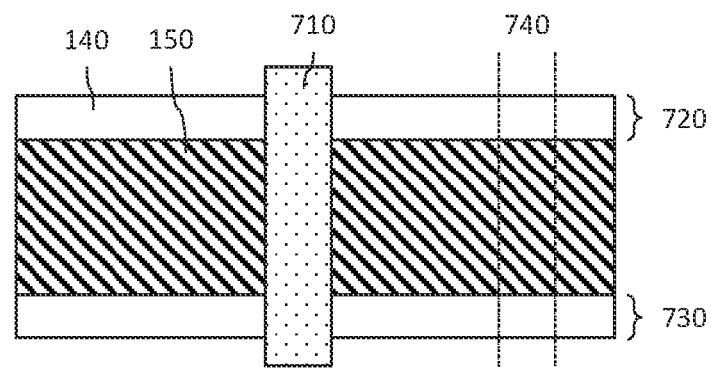

FIGS. 7A and 7B show an act of fabricating a bonded blank 700 according to a method for fabricating an external contact element. FIG. 7A shows a sectional view and FIG. 7B shows a top view along the arrow A in FIG. 7A.

As shown in FIGS. 7A and 7B, the first sheet 140 and the second sheet 150 are joined together by applying pressure, e.g. by using rollers 710, to form the bonded blank 700. The first sheet 140 has a larger width than the second sheet 150 as viewed from above, such that at least a first margin 720 is not covered by the second sheet 150. According to an example, the bonded blank 700 may also be configured such that a second margin 730, opposite the first margin 720, as well is not covered by the second sheet 150. According to another example, the bonded blank 700 does not comprise an exposed second margin 730.

The bonded blank 700 may be singulated into bonded blank strips by cutting along cutting lines 740. The exposed first margin 720 may be used to form the first contact portion 110. The second margin 730 may be used to form the second contact portion 120 (wherein the second sheet 150 is omitted from the second contact portion 120).

Fabricating an external contact element like the external contact elements 100 to 500 may further comprise bending or punching a bonded blank strip in order to fabricate the shape of the external contact element. This may be done prior to cutting along the cutting lines 740 or after cutting. Furthermore, the fabrication process may comprise an act of fabricating the spacers 310, the grooves 320 and/or the through hole 520. This may e.g. also be done by punching.

In the following, external contact elements as well as semiconductor modules comprising an external contact element are further described using specific examples.

Example 1 is an external contact element for a power semiconductor module, wherein the external contact element comprises a bonded blank strip, the bonded blank strip being formed such that the external contact element comprises: a first contact portion configured to be coupled to the power semiconductor module by a first solder joint, a second contact portion spaced from the first contact portion in a thickness direction out of the plane of the first contact portion, the second contact portion being configured to be coupled to an external appliance, and a spring portion connecting the first and second contact portions to each other and configured to compensate a movement along the thickness direction, wherein the bonded blank strip comprises a first sheet comprising a first metal or first metal alloy and a second sheet comprising a different second metal or second metal alloy, and wherein the second sheet is omitted from at least a substantial part of the first contact portion.

Example 2 is the external contact element of example 1, wherein the first metal or first metal alloy is or comprises Cu and wherein the second metal or second metal alloy is or comprises Al.

Example 3 is the external contact element of example 1 or 2, wherein the first contact portion comprises at least two spacers separated by a groove such that a thickness of the first solder joint in the groove is defined by the height of the spacers.

Example 4 is the external contact element of one of the preceding examples, wherein the spring portion comprises a compression or extension spring forming at least one arc.

Example 5 is the external contact element of one of the preceding examples, wherein the spring portion comprises two compression or extension springs arranged laterally next to each other.

Example 6 is the external contact element of example 5, wherein the second contact portion comprises a through hole such that the second contact portion may be coupled to the external appliance by a rivet or a screw.

Example 7 is the external contact element of example 5 or 6, wherein the bonded blank strip is bent into shape such that both ends of the bonded blank strip are located at the first contact portion.

Example 8 is the external contact element of one of the preceding examples, wherein the external contact element is shaped such that the second sheet of the bonded blank strip does not come into direct contact with the power semiconductor module or the external appliance.

Example 9 is the external contact element of one of the preceding examples, wherein the external contact element has a first length measured along the thickness direction of 5 mm or more.

Example 10 is the external contact element of one of the preceding examples, wherein the first sheet and the second sheet each have a thickness of 0.1 mm or more.

Example 11 is the external contact element of one of the preceding examples, wherein the first and second contact portions have a second length measured perpendicular to the thickness direction of 3 mm or more.

Example 12 is the external contact element of one of the preceding examples, wherein the first and second contact portions each have an essentially rectangular or quadratic shape.

Example 13 is the external contact element of one of the preceding examples, wherein the first and second contact portions are perpendicular to the thickness direction of the external contact element.

Example 14 is an external contact element for a power semiconductor module, wherein the external contact element comprises a sheet metal, the sheet metal being formed such that the external contact element comprises: a first contact portion configured to be coupled to the power semiconductor module by a first solder joint, a second contact portion spaced from the first contact portion in a thickness direction out of the plane of the first contact portion, the second contact portion being configured to be coupled to an external appliance, and a spring portion connecting the first and second contact portions to each other and configured to compensate a movement along the thickness direction, wherein the sheet metal comprises a first metal or first metal alloy, and wherein the first contact portion comprises at least two spacers separated by a groove such that a thickness of the first solder joint in the groove is defined by the height of the spacers.

Example 15 is the external contact element of example 14, wherein the first metal or first metal alloy is or comprises Cu.

Example 16 is the external contact element of example 14 or 15, wherein a height of the spacers is 40% or more of the thickness of the external contact element.

Example 17 is the external contact element of one of examples 14 to 16, wherein the spacers occupy 70% or less of the surface area of the first contact portion.

Example 18 is a power semiconductor module, comprising: at least one power semiconductor chip, at least one control contact element configured to transmit an external control signal to the power semiconductor module, and at least one external contact element according to one of claims 1 to 17, wherein the at least one external contact element is a power contact of the power semiconductor module.

Example 19 is the power semiconductor module of example 18, wherein the at least one control contact element is a pressfit pin or a soldering pin.

Example 20 is the power semiconductor module of example 18 or 19, wherein the at least one control contact element and the at least one external contact element are arranged on a first side of the power semiconductor module and wherein an opposing second side of the power semiconductor module is configured to be coupled to a heatsink.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. An external contact element for a power semiconductor module, wherein the external contact element comprises a bonded blank strip, the bonded blank strip being formed such that the external contact element comprises:
   a first contact portion configured to be coupled to the power semiconductor module by a first solder joint;
   a second contact portion spaced from the first contact portion in a thickness direction out of a plane of the first contact portion, the second contact portion being configured to be coupled to an external appliance; and
   a spring portion connecting the first and second contact portions to each other and configured to compensate a movement along the thickness direction,
   wherein the bonded blank strip comprises a first sheet comprising a first metal or first metal alloy and a second sheet comprising a different second metal or second metal alloy, and
   wherein the second sheet is omitted from at least a substantial part of the first contact portion.

2. The external contact element of claim 1, wherein the first metal or first metal alloy is or comprises Cu and wherein the second metal or second metal alloy is or comprises Al.

3. The external contact element of claim 1, wherein the first contact portion comprises at least two spacers separated by a groove such that a thickness of the first solder joint in the groove is defined by the height of the spacers.

4. The external contact element of claim 1, wherein the spring portion comprises a compression or extension spring forming at least one arc.

5. The external contact element of claim 1, wherein the spring portion comprises two compression or extension springs arranged laterally next to each other.

6. The external contact element of claim 5, wherein the second contact portion comprises a through hole such that the second contact portion may be coupled to the external appliance by a rivet or a screw.

7. The external contact element of claim 5, wherein the bonded blank strip is bent into shape such that both ends of the bonded blank strip are located at the first contact portion.

8. The external contact element of claim 1, wherein the external contact element is shaped such that the second sheet of the bonded blank strip does not come into direct contact with the power semiconductor module or the external appliance.

9. The external contact element of claim 1, wherein the external contact element has a first length measured along the thickness direction of 5 mm or more.

10. The external contact element of claim 1, wherein the first sheet and the second sheet each have a thickness of 0.1 mm or more.

11. The external contact element of claim 1, wherein the first and second contact portions have a second length measured perpendicular to the thickness direction of 3 mm or more.

12. The external contact element of claim 1, wherein the first and second contact portions each have a rectangular or quadratic shape.

13. The external contact element of claim 1, wherein the first and second contact portions are perpendicular to the thickness direction of the external contact element.

14. An external contact element for a power semiconductor module, wherein the external contact element comprises a sheet metal, the sheet metal being formed such that the external contact element comprises:

a first contact portion configured to be coupled to the power semiconductor module by a first solder joint;

a second contact portion spaced from the first contact portion in a thickness direction out of a plane of the first contact portion, the second contact portion being configured to be coupled to an external appliance; and a spring portion connecting the first and second contact portions to each other and configured to compensate a movement along the thickness direction, wherein the sheet metal comprises a first metal or first metal alloy, and wherein the first contact portion comprises at least two spacers separated by a groove such that a thickness of the first solder joint in the groove is defined by the height of the spacers.

15. The external contact element of claim 14, wherein the first metal or first metal alloy is or comprises Cu.

16. The external contact element of claim 14, wherein a height of the spacers is 40% or more of the thickness of the external contact element.

17. The external contact element of claim 14, wherein the spacers occupy 70% or less of the surface area of the first contact portion.

18. A power semiconductor module, comprising:

at least one power semiconductor chip;

at least one control contact element configured to transmit an external control signal to the power semiconductor module; and at least one external contact element according to claim 1 or claim 14, wherein the at least one external contact element is a power contact of the power semiconductor module.

19. The power semiconductor module of claim 18, wherein the at least one control contact element is a pressfit pin or a soldering pin.

20. The power semiconductor module of claim 18, wherein the at least one control contact element and the at least one external contact element are arranged on a first side of the power semiconductor module and wherein an opposing second side of the power semiconductor module is configured to be coupled to a heatsink.

* * * * *